United States Patent
Khanifar et al.

(10) Patent No.: US 7,106,134 B2
(45) Date of Patent: Sep. 12, 2006

(54) FEED FORWARD AMPLIFIER EMPLOYING BIAS CIRCUIT TOPOLOGIES FOR MINIMIZATION OF RF AMPLIFIER MEMORY EFFECTS

(75) Inventors: Ahmad Khanifar, Laguna Hills, CA (US); Nikolai Maslennikov, Huntington Beach, CA (US); Gareth Spiller, North Somerset (GB)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 11/295,926

(22) Filed: Dec. 6, 2005

(65) Prior Publication Data

US 2006/0087374 A1    Apr. 27, 2006

Related U.S. Application Data

(62) Division of application No. 10/410,457, filed on Apr. 8, 2003, now Pat. No. 7,034,620.

(60) Provisional application No. 60/375,864, filed on Apr. 26, 2002, provisional application No. 60/375,069, filed on Apr. 24, 2002.

(51) Int. Cl.
*H03F 1/00* (2006.01)

(52) U.S. Cl. .................. 330/151; 330/296; 330/302

(58) Field of Classification Search ............... 330/151, 330/296, 302, 306
See application file for complete search history.

(56) References Cited

U.S. PATENT DOCUMENTS

| | | | |
|---|---|---|---|
| 4,717,884 A | 1/1988 | Mitzlaff | |
| 4,719,430 A | 1/1988 | Cole | |
| 4,760,350 A | 7/1988 | Ayasli | |
| 5,159,287 A | 10/1992 | Furutani et al. | |
| 5,177,452 A | 1/1993 | Honjo | |
| 5,206,608 A | 4/1993 | Torres | |
| 5,250,912 A | 10/1993 | Fujita | |
| 5,272,450 A | 12/1993 | Wisherd | |
| 5,329,249 A | 7/1994 | Cripps | |
| 5,357,213 A | 10/1994 | Michel et al. | |
| 5,361,038 A | 11/1994 | Allen et al. | |
| 5,406,226 A | 4/1995 | Cioffi et al. | |
| 5,568,087 A | 10/1996 | Gatti | |
| 5,592,122 A | 1/1997 | Masahiro et al. | |
| 5,606,286 A | 2/1997 | Bains | |
| 5,617,061 A | 4/1997 | Fukuchi | |
| 5,760,632 A * | 6/1998 | Kawakami et al. | ......... 327/355 |

(Continued)

OTHER PUBLICATIONS

Feedforward—An Alternative Approach to Amplifier Linearization, T.J. Bennett, R.F. Clements, *The Radio and Electronic Engineer*, vol. 44, No. 5, May 1974.

(Continued)

*Primary Examiner*—Patricia Nguyen
(74) *Attorney, Agent, or Firm*—David L. Henty; Myers Dawes Andras & Sherman LLP

(57) ABSTRACT

An RF power amplifier having reduced memory effects is disclosed. This is achieved by a novel design of the DC supply feed network to achieve low impedance across video frequencies, whilst maintaining the correct RF output matching. One or more transmission zeros are provided in the bias circuit transfer function, which are positioned in the video bandwidth so as to provide low and relatively constant impedance across the video bandwidth. Also, a parallel DC feed line may be employed to reduce impedance across the video bandwidth. The reduction in memory effects allows improved performance of predistortion linearization techniques and an implementation in a feed forward amplifier employing predistortion linearization is also disclosed.

1 Claim, 4 Drawing Sheets

U.S. PATENT DOCUMENTS

| | | | |
|---|---|---|---|
| 5,783,965 A * | 7/1998 | Iwatsuki et al. | 327/532 |
| 5,999,056 A | 12/1999 | Fong | |
| 6,081,160 A | 6/2000 | Custer et al. | |
| 6,107,877 A | 8/2000 | Miguelez et al. | |
| 6,121,841 A | 9/2000 | Sakuno | |
| 6,122,532 A | 9/2000 | Taylor | |
| 6,130,589 A | 10/2000 | Yamaguchi et al. | |
| 6,140,858 A | 10/2000 | Dumont | |
| 6,281,755 B1 | 8/2001 | Feld et al. | |
| 6,307,436 B1 | 10/2001 | Hau | |
| 6,313,705 B1 | 11/2001 | Dening et al. | |
| 6,342,810 B1 | 1/2002 | Wright et al. | |
| 6,346,853 B1 | 2/2002 | Kangaslahti et al. | |
| 6,353,360 B1 | 3/2002 | Hau et al. | |
| 6,369,656 B1 | 4/2002 | Dening et al. | |
| 6,373,331 B1 | 4/2002 | Smiley et al. | |
| 6,437,649 B1 | 8/2002 | Miyashita et al. | |
| 6,828,862 B1 | 12/2004 | Barak | 330/302 |
| 6,934,341 B1 * | 8/2005 | Sahlman | 375/297 |
| 2001/0013809 A1 | 8/2001 | Fujiwara et al. | |
| 2001/0040483 A1 | 11/2001 | Dening et al. | |
| 2002/0014922 A1 | 2/2002 | Leich et al. | |
| 2002/0017954 A1 | 2/2002 | Hau et al. | |
| 2002/0033735 A1 | 3/2002 | Hasegawa et al. | |
| 2002/0125955 A1 | 9/2002 | Leighton et al. | |
| 2002/0135427 A1 | 9/2002 | Yokota | |

OTHER PUBLICATIONS

Measurement Technique for Characterizing Memory Effects in RF Power Amplifiers, J. Vuolevi, T. Rahkonen, J. Mamminen, IEE Transactions in Microwave Theory and Techniques, vol. 49, No. 8, Aug. 2001.

Measurement and Stimulation of Memory Effects in Predistortion Linearizers, W. Bosch, G. Gatti, IEE Transactions in Microwave Theory and Techniques, vol. 37, No. 12, Dec. 2001.

* cited by examiner

FEED FORWARD AMPLIFIER EMPLOYING BIAS CIRCUIT TOPOLOGIES FOR MINIMIZATION OF RF AMPLIFIER MEMORY EFFECTS

RELATED APPLICATION INFORMATION

The present application is a divisional application of U.S. Ser. No. 10/410,457 filed Apr. 8, 2003 now U.S. Pat. No. 7,034,620 which claims the benefit pursuant to 35 USC § 119(e) of the priority date of U.S. Provisional Patent Application Ser. No. 60/375,069, filed on Apr. 24, 2002 and U.S. Provisional Patent Application Ser. No. 60/375,864, filed on Apr. 26, 2002, the entire contents of which are hereby expressly incorporated herein by reference.

BACKGROUND OF THE INVENTION

1. Field of the Invention

The present invention relates in general to RF power amplifiers and RF amplification methods. The present invention is also more specifically related to DC supply (bias) feed networks for RF power amplifiers.

2. Description of the Prior Art and Related Information

Radio frequency (RF) power amplifiers are commonly used in numerous applications, such as base stations used in wireless communication systems. The signals which may be amplified by an RF power amplifier include an RF high frequency modulated carrier, for example having a fundamental frequency of around 2 gigahertz (GHz). The base band signal component which modulates the carrier is commonly at lower frequency Depending on the application, the base band (video) bandwidth can be anything from 30 kilohertz (KHz), such as for older cellular telephones, to 20 megahertz (MHz) or more, such as for multi-carrier W-CDMA (Wideband-Code Division Multiple Access) applications such as UMTS (Universal Mobile Telecommunication System).

The two primary goals of RF power amplifier design are linearity over the range of power operation and efficiency. Linearity is simply the ability to amplify without distortion while efficiency is the ability to convert DC to RF energy with minimal wasted power and heat generation. Both these requirements are critical for modern wireless communication systems but mutually exclusive in nature. This is due primarily to the bandwidth requirements of modern wireless communication systems which are placing increasing demands on amplifier linearity.

One source of distortion in RF power amplifiers which is increasingly significant at higher video bandwidths is related to the DC power supply circuit for supplying power to the active devices, e.g., LDMOS transistors, employed in the amplifier. The finite impedance in the amplifier DC supply circuit results in a voltage drop at the transistor output terminal, and hence a parasitic modulation of the drain voltage. This parasitic modulation interacts with the RF signal and creates intermodulation distortion products (IMDs), resulting in an increase in the amount and complexity of distortion present at the amplifier output. Ideally, to minimize this distortion, the bias circuit should have a low impedance at the frequency of the signal modulation, i.e., a low video impedance. The move towards increasing signal bandwidth (e.g. 20 MHz for 4-carrier UMTS) means that the frequency range over which low video impedance is required is also increasing. Due to inherent impedances in the bias circuit elements at MHz frequencies, it is becoming increasingly difficult to maintain low video impedance across the video bandwidth.

The problem of maintaining low impedance across the video bandwidth is made much more difficult by the second key requirement of RF power amplifiers; good efficiency. Good amplifier efficiency requires that there be minimal power losses due to impedance mismatching at the amplifier output. An output matching circuit is typically provided to match the impedance at the output to the device impedance and minimize power loss, whilst achieving the desired power bandwidth of operation. Ideally, the bias circuit should not impact on this output impedance matching. Therefore, at the RF carrier frequency, the bias circuit should have a high impedance, to prevent loading of the matching circuit. Therefore, there are two requirements which tend to conflict with each other. By keeping the bias circuit video impedance low, linearity is maintained and distortion of the video signal is minimized but at the same time, the bias circuit must have high impedance at the RF carrier frequency to avoid power loss.

Conventional approaches to this problem employ a number of decoupling capacitors in parallel to reduce video impedance. Each capacitor is chosen for its low impedance over a certain frequency range, this bandwidth being centered on the series self-resonance of the capacitor. An RF blocking inductance, such as a short-circuit quarter-wave transmission line at the RF carrier wavelength, is then provided between the decoupling capacitors and the transistor drain/collector terminal, to provide a high impedance to the RF signal, thereby minimizing the effect of the bias network on the RF output match. Such an approach is described, for example, in U.S. Pat. No. 6,081,160 to Custer et al. FIG. 1 shows such a prior bias circuit coupled between a DC voltage supply port 1 and a transistor drain or collector port 2. As shown, the decoupling capacitors 4, having capacitances C1–C4, are connected to the output 2 of the transistor via an inductor/quarter-wave transmission line 3. However, the inductance of the quarter-wave transmission line becomes increasingly significant as the video/modulation frequency increases. This inductance is in series with the decoupling capacitors and has the effect of significantly lowering the series resonance of the high video frequency decoupling capacitors as measured at the device output terminal 2. Therefore, at higher video frequencies this inductance can increase the video impedance causing distortion by parasitic modulation of the RF signal.

The significance of the problem of distortion due to bias circuit impedance is increased by its resistance to known techniques for eliminating distortion. In order to reduce the distortion of RF power amplifiers, several techniques have been employed, amongst which, feed forward linearization is most popular for its wideband performance. Predistortion linearization techniques, such as adaptive digital predistortion (ADPD) linearization, have also been employed for reducing IMD components in RF power amplifiers. However, predistortion cannot be effectively employed to reduce distortion caused by varying bias circuit impedance across the video bandwidth. The interaction of the bias supply impedance with the RF signal creates time-varying RF intermodulation distortion products, a phenomenon generally known as the memory effect. The memory effect is difficult to correct even by the most sophisticated predistortion linearization techniques used in power amplifier systems. The distortion caused by a variation in bias circuit video impedance is thus extremely difficult to remove in any practical predistortion linearization scheme. Therefore, the variation in bias circuit video impedance creates a barrier to increasing the effectiveness of predistortion linearization in wide bandwidth applications.

Although there have been attempts to address the above outlined problem, a fully satisfactory solution has not been provided. Accordingly, there exists a need to address the problem of bias circuit video impedance for wide bandwidth applications and the associated RF amplifier memory effects problem so as to improve the amplifier performance.

SUMMARY OF THE INVENTION

In a first aspect the present invention provides an RF amplifier comprising an input receiving an RF input signal, an active amplifier device receiving and amplifying the input signal to provide an output, the active amplifier device having a power supply connection, and a bias circuit coupled between a DC power supply and the active amplifier device power supply connection. The bias circuit comprises an RF blocking inductance and a first set of decoupling capacitors coupled in a parallel configuration to a ground connection and configured between the DC power supply and the RF blocking inductance. The bias circuit further comprises a second set of one or more decoupling capacitors coupled to a ground connection and configured between the active device power supply connection and the RF blocking inductance.

In a preferred embodiment the RF blocking inductance may comprise a printed conductive line having an impedance at least ten times the device output impedance. The bias circuit further may further comprise an RF shunt capacitor coupled to a ground connection to form an RF parallel-resonant circuit with the second set of one or more decoupling capacitors. In one preferred embodiment the shunt capacitor may have a capacitance of about 0.5–5 pF. The second set of one or more decoupling capacitors may comprise a capacitor having a capacitance of about 0.1–1 µF. Alternatively, the second set of one or more decoupling capacitors may comprise first and second capacitors coupled in parallel to a ground connection. For example, the first and second capacitors may have different capacitances selected in the range of about 0.1–1 µF. More specifically, the first capacitor may have a capacitance of about 0.1 µF and the second capacitor a capacitance of about 1 µF. The active amplifier device may comprise an LDMOS transistor and the power supply connection may comprise a drain contact. The RF blocking inductance may further comprise a capacitor coupled to the line at a spacing of one sixteenth to one quarter wavelength of the RF input signal from the device power supply connection and having a capacitance acting as a short to ground at the frequency of the RF input signal.

The amplifier may further comprise an output impedance matching circuit coupled to the output of the active amplifier device and the RF shunt capacitor may be incorporated as part of the output matching circuit in the form of a lumped or distributed component. The amplifier may also further comprise an input impedance matching circuit coupled between the input of the amplifier and the active amplifier device.

In another aspect the present invention provides an RF amplifier comprising an input receiving an RF input signal comprising an RF carrier and a modulation signal having a modulation bandwidth of at least 5 MHz and an active amplifier device receiving and amplifying the input signal to provide an output, the active amplifier device having a power supply connection. A bias circuit is coupled between a DC power supply and the active amplifier device power supply connection. The bias circuit comprises a network of circuit elements having an impedance versus frequency response having plural minima spaced across the modulation bandwidth and an impedance at the RF carrier frequency at least ten times the output impedance of the active amplifier device.

In a preferred embodiment the network of circuit elements comprises plural decoupling capacitors having series resonances at frequencies spaced over the modulation bandwidth. Preferably, at least one of the plural decoupling capacitors comprises a surface mount capacitor. Also, at least one of the plural decoupling capacitors is preferably coupled to the transmission line at a spacing of less than one sixteenth wavelength of the RF carrier from the device power supply connection. The network of circuit elements preferably further comprises a transmission line coupled to the active amplifier device power supply connection and an RF short capacitor coupled to ground and to the transmission line at a spacing of between one sixteenth and one quarter wavelength of the RF carrier from the device power supply connection. The network of circuit elements may further comprise a small value capacitor coupled to ground adjacent the device power supply connection to form a parallel resonance circuit with the decoupling capacitor coupled to the transmission line at a spacing of less than one sixteenth wavelength from the device power supply connection. For example, the small value capacitor may have a capacitance of about 0.5 to 5 pF.

In another aspect the present invention provides an RF amplifier comprising an input receiving an RF input signal, an active amplifier device receiving and amplifying the input signal to provide an output, the active amplifier device having a power supply connection, and a bias circuit coupled between a DC power supply and the active amplifier device power supply connection. The bias circuit comprises parallel power supply feed lines connected to the active amplifier device power supply connection and a plurality of decoupling capacitors coupled in a parallel configuration to a ground connection and electrically coupled to the DC power supply and the parallel power supply bias feed lines.

In a preferred embodiment the bias circuit may further comprise a surface mount capacitor coupled to one of the feed lines within one sixteenth wavelength of the RF carrier signal from the active amplifier device power supply connection. The bias circuit may also further comprise a small value capacitor coupled to ground adjacent the device power supply connection to form a parallel-resonant circuit with the surface mount capacitor.

In another aspect the present invention provides a method of amplifying an RF input signal. The method comprises providing an input signal, comprising a modulating signal having a video bandwidth and an RF carrier, to an RF amplifier device having a power supply connection. The method further comprises providing DC power from a DC supply to the RF amplifier device power supply connection along parallel feed lines and providing a low impedance to the supplied power across the video bandwidth and an impedance at least ten times the device output impedance at the frequency of the RF carrier.

In another aspect the present invention provides a bias circuit for use with an amplifier having an active device power supply connection. The bias circuit comprises a DC power supply connection and an RF blocking inductance. A first set of decoupling capacitors are coupled in a parallel configuration to a ground connection and configured between the DC power supply and the RF blocking inductance. A second set of one or more decoupling capacitors is coupled to a ground connection and configured between the active device power supply connection and the RF blocking inductance. In a preferred embodiment the second set of decoupling capacitors are configured to be close to a parallel resonance at the RF carrier frequency.

In another aspect the present invention provides an RF amplifier comprising an input receiving an input signal comprising an RF carrier and a modulation signal having a modulation bandwidth of at least 5 MHz. The amplifier further comprises an active amplifier device receiving and amplifying the input signal to provide an output, the active amplifier device having a power supply connection, and a bias circuit coupled between a DC power supply and the active amplifier device power supply connection. The bias circuit comprises a network of circuit elements having an impedance versus frequency response having at least one minimum in the modulation bandwidth and a low impedance across the modulation bandwidth so as to minimize amplifier memory effects and a higher impedance from a parallel resonance close to the RF carrier frequency, wherein the impedance at the RF carrier frequency is at least ten times the output impedance of the active amplifier device.

In a preferred embodiment the amplifier further comprises a predistorter receiving and predistorting the input signal prior to the active amplifier device receiving and amplifying the input signal.

In another aspect the present invention provides a feed forward amplifier. The feed forward amplifier comprises an RF input for receiving an RF signal having an RF carrier and a modulation bandwidth of at least 10 MHz, a predistortion circuit receiving and predistorting the RF input signal, and a main amplifier receiving and amplifying the predistorted RF signal. The main amplifier comprises an active device and a bias circuit coupled to a DC power supply, the bias circuit having a transfer function having a plurality of transmission zeros spaced across the modulation bandwidth so as to substantially eliminate amplifier memory effects. The feed forward amplifier further comprises a main amplifier output sampling coupler, a first delay coupled to the RF input and providing a delayed RF signal, a carrier cancellation combiner coupling the delayed RF signal to the sampled output from the main amplifier, an error amplifier receiving and amplifying the output of the carrier cancellation combiner, a second delay coupled to the output of the main amplifier, an error injection coupler combining the output from the error amplifier and the delayed main amplifier output from the second delay so as to cancel distortion introduced by the main amplifier, and an RF output coupled to the error injection coupler output and providing an amplified RF output.

Further features and aspects of the invention are set out in the following detailed description.

DETAILED DESCRIPTION OF THE INVENTION

Figure 2:
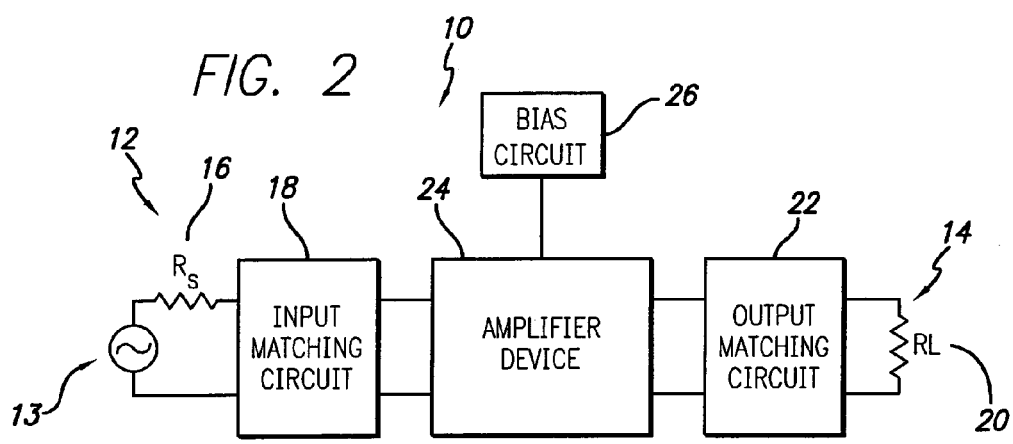
FIG. 2 illustrates an RF power amplifier in block schematic form in accordance with the present invention.
Figure 3:
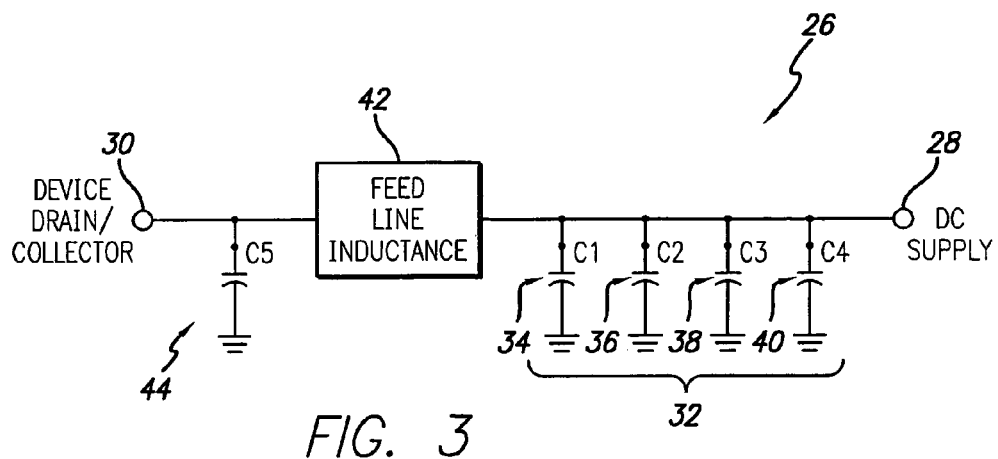
FIG. 3 illustrates a schematic drawing of a bias circuit employed in the amplifier of FIG. 2, in accordance with the present invention.

Referring to FIGS. 2 and 3 a first embodiment of the present invention is illustrated. More particularly, FIG. 2 illustrates an RF power amplifier in block schematic form and FIG. 3 illustrates a schematic drawing of a bias circuit employed in the amplifier of FIG. 2, in accordance with the present invention.

Referring first to FIG. 2, the amplifier 10 is illustrated in a block schematic drawing. The amplifier 10 includes an input 12 which receives an input RF signal 13 to be amplified and an output 14 at which is output the amplified RF signal. The RF signal may be a wide bandwidth signal such as a CDMA (Code Division Multiple Access) spread spectrum communication signal or W-CDMA (Wideband-Code Division Multiple Access) signal such as in UMTS applications, or other high video bandwidth signal. The video bandwidth may thus be greater than 10 MHz, e.g., 20 MHz for 4-carrier UMTS. The input will have an associated impedance illustrated schematically by the source resistance 16 and the amplifier will have an input matching circuit 18 to minimize the input impedance mismatch which the circuit may be implemented in a manner conventional in the art. The output will also have an impedance illustrated schematically by load 20 and the amplifier will have an output matching circuit 22 to minimize the output impedance mismatch which circuit may be implemented to provide conjugate impedance matching with the particular active device in a manner conventional in the art. The active amplifier device 24 may comprise a power transistor or transistors such as an LDMOS transistor or bipolar transistor. The active amplifier device 24 receives a DC supply voltage from bias circuit 26 which is coupled to the drain or collector of the amplifier transistor, depending on the device type. The bias circuit 26 employs a combination of circuit topology and electrical properties of the circuit elements to achieve a very low-impedance supply up to tens of megahertz of video bandwidth while maintaining high impedance at RF frequencies. Preferred embodiments of the bias circuit 26 are described below. Although bias circuit 26 is shown in FIG. 2 and described below as a separate circuit from output matching circuit 22, it may also be incorporated in circuit 22 as will be appreciated by those skilled in the art.

Referring to FIG. 3, a first embodiment of bias circuit 26 is illustrated. As shown in FIG. 3, bias circuit 26 includes a DC voltage supply 28 and a device drain or collector connection 30. A first set of decoupling capacitors 32 are provided. Capacitor 34 has a low impedance at the RF carrier frequency which is transformed to a high impedance by the line 42. The capacitors 36, 38 and 40 are illustrated having capacitances C2–C4 chosen to have series resonance values or low impedances at the lower video/modulation frequencies (e.g., DC-1 MHz), however, more or fewer capacitors may be provided in this first set of decoupling capacitors 32. A feed line 42 is provided between the decoupling capacitors 32 and the device connection 30 to both feed DC power to the drain/collector and provide a high RF impedance relative to the output matching circuit 22 (shown in FIG. 2). The feed line 42 may comprise a printed transmission line/inductor having a width and length to provide an RF blocking inductance at the RF carrier frequency much larger than the impedance of the active device and output matching circuit. For example, currently available LDMOS devices have output impedance of about 1–2 ohms or less and the RF blocking inductance 42 should be about ten times that for such devices. A transmission line with an effective length equal to one sixteenth to one quarter of the RF carrier wavelength may be suitable for RF blocking inductance 42 for such low output impedance active amplifier devices such as currently available LDMOS devices. For higher output impedance amplifier devices a more robust RF blocking inductance such as a one quarter wavelength transmission line may be preferred. An RF short capacitor may also be provided at the partial wavelength spacing from the drain/collector to increase RF impedance by providing a short to ground at RF frequency. For example, the teachings of the above noted '160 patent may be employed, the disclosure of which is incorporated herein by reference in its entirety. Other capacitance values and implementations of the RF blocking inductance may also be employed as will be appreciated by those skilled in the art.

Still referring to FIG. 3, a second set of decoupling capacitor/capacitors 44 with a low impedance at the higher video/modulation frequencies (e.g., 5–20 MHz) is/are provided. For example, capacitance values in the range of 0.1–1 µF may provide the desired low impedance at such higher modulation frequencies. Decoupling capacitor/capacitors 44 are positioned close enough to the device output terminal 30 so that the inductance between the device and the decoupling capacitance has no detrimental effect on the overall matching and load impedance presented to the output of the transistor. Such spacing will preferably be as close as allowed by the mounting requirements of the capacitor and the device on the amplifier substrate.

Figure 4:
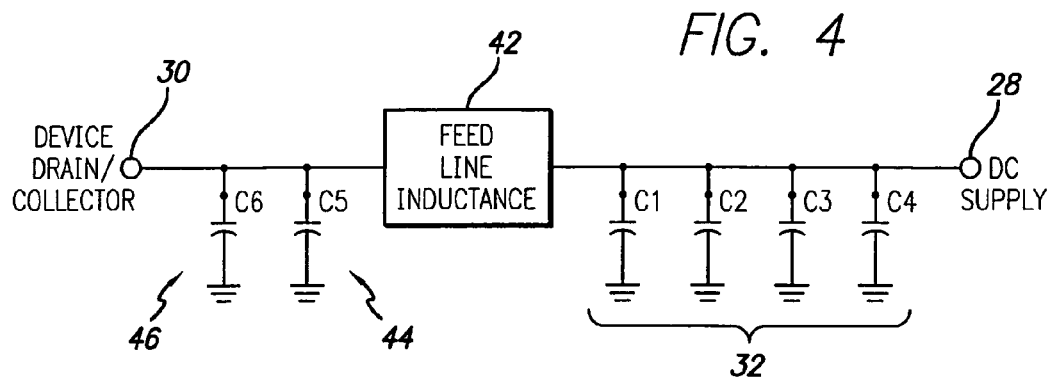
FIG. 4 illustrates a schematic drawing of another implementation of the bias circuit of FIG. 3 in accordance with the present invention.

To avoid compromising the output matching (and hence efficiency and power bandwidth) of the RF amplifier, circuit 26 should also have high impedance at RF. This is achieved by adding a small value capacitor in parallel with the close-in decoupling capacitor 44 in FIG. 3. Referring to FIG. 4 an embodiment of the bias circuit employing such a parallel small value capacitor is illustrated in a schematic drawing. The circuit components with matching numerals are as described in relation to FIG. 3. At RF frequencies, the decoupling capacitor 44 (described in relation to FIG. 3) is predominantly inductive, therefore by adding a capacitor 46 with a small value capacitance C6 (e.g., 0.5–5 pF) creates a parallel-resonant circuit with high impedance at RF, which will have a negligible effect on the RF output match of the RF power transistor. Also, as will be appreciated by those skilled in the art, capacitor 46 (capacitance C6) may be incorporated as part of the output matching network, in the form of a lumped or distributed component.

Figures 7, 9:
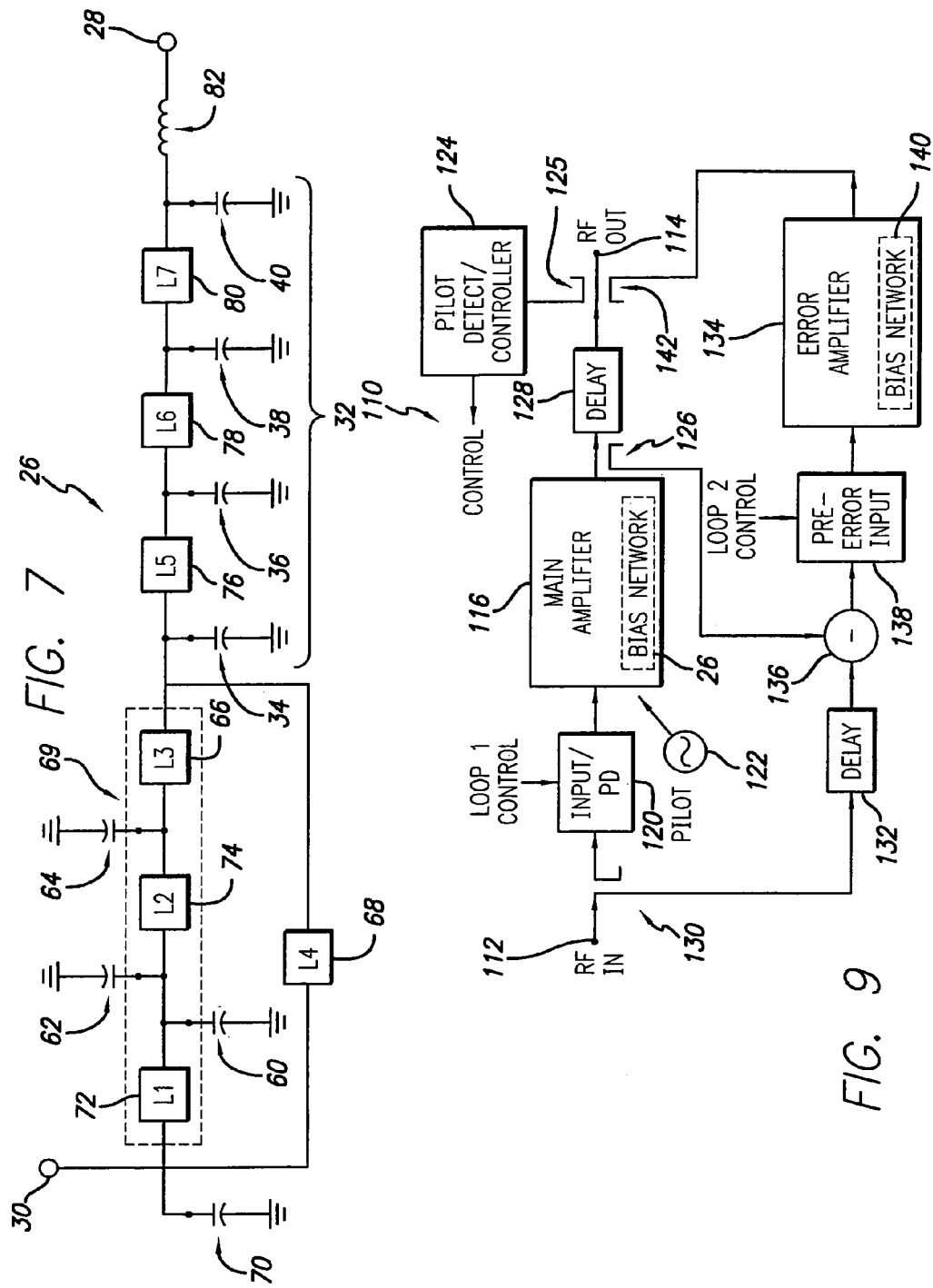
FIG. 7 illustrates a schematic drawing of another implementation of the bias circuit in accordance with the present invention.
FIG. 9 illustrates a block schematic drawing of a feed forward amplifier employing predistortion and a bias circuit in accordance with the present invention.

The invention thus employs a combination of physical layout and electrical properties of the decoupling capacitors to achieve a very low impedance supply up to tens of megahertz, while maintaining high impedance at RF frequencies. The present invention may be implemented in a number of different topologies, to make use of, or minimize the effect of parasitic reactance in the RF output match and any interactive resonances between discrete components and printed lines. Also, one specific implementation of the present invention employs twin parallel drain feeds. An example of such use of twin parallel drain feeds is shown in FIG. 7 described below.

The bias circuit of this invention is generally applicable to all amplifiers, and it is specifically advantageous when the RF power amplifier is used in conjunction with predistortion linearization. This advantage is related to power amplifier memory effects in general. The following section first explains the principles of power amplifier operation and memory effects in general. The outlined theory is then used to describe a general implementation of this invention wherein memory effect reduction is achieved by placing transmission zeros in the bias network transfer function. Transmission zeros at the output of the device are formed by utilizing series resonance properties of (surface mount) capacitors. The resonance frequencies are adjusted selectively to lower and even out the frequency response of the bias network. Another specific bias circuit embodiment and an implementation in a feed forward amplifier using predistortion linearization will then be described.

The figure of merit to describe the linearity of a power amplifier is the adjacent channel power ratio (ACPR) and is defined as the ratio of a wanted signal power and unwanted distortion generated as a result of amplifier nonlinear transfer characteristics.

A frequently used, simplistic representation of amplifier transfer function is a memoryless function and is given as:

$$i_{out} = g_1 v_{in} + g_2 v_{in}^2 + g_3 v_{in}^3 + g_4 v_{in}^4 + g_5 v_{in}^5 + \quad (1)$$

where $g_1$–$g_n$ are complex coefficients.

If a two-tone signal of equal amplitude is applied to the input of such a circuit, $$v_{in} = V_{in} \cos(\omega_1 t) + V_{in} \cos(\omega_2 t) \quad (2)$$

the level of $3^{rd}$ order (IM3) is given as:

$$IM3 = \frac{3}{4} \cdot g_3 \cdot V_{in}^3 \quad (3)$$

The IM3 sidebands are not a function of input frequency tone spacing and the distortion level increases in proportion to the $3^{rd}$ power of the input signal amplitudes. If an RF amplifier behaves accordingly, a digital predistorter can be designed to remove the intermodulation distortion over a wide frequency range (or modulation bandwidth). However in practice, the IMD level of a power amplifier normally is a function of tone spacing (or the bandwidth of the modulating signal) and therefore, has a severe impact on the performance of predistortion linearization by limiting the distortion cancellation. This is a result of the memory effects.

The memory effects make the IM3 sidebands a function of tone spacing (modulation bandwidth) and this is attributed to $2^{nd}$ order nonlinear terms in the amplifier transfer function equation (1). This is caused by up-conversion of the signal envelope to produce $3^{rd}$ order IM. Since the nonlinearity of the active device can be modeled as a superposition of current sources, the impedance at the device terminal can affect the respective generated video voltage waveforms (both amplitude and phase). The upconverted IM3 sideband levels are therefore a function of impedance at the envelope frequency that ranges from DC to several tens of MHz.

The above discussion can be summarized as follows; if equation (1) is truncated to the $3^{rd}$ term, the main contributor to IMD3 is the device $3^{rd}$ order nonlinearity that is affected by the impedance in carrier RF frequency and remains constant over the frequency range of interest. Nonetheless, the $2^{nd}$ order nonlinearity will also contribute to the IM3 distortion but its contribution is a function of the impedance levels at the envelope frequency. While the predistortion can suppress the $3^{rd}$ order or even higher order nonlinear distortions by producing the inverse of the amplifier transfer function, the predistortion algorithms tends to fail in resolving the memory effects as the cause, i.e. the video signal, is an increasing function of frequency. Therefore, the amplifier electrical memory effects are responsible for limiting the performance of the digital predistorter.

Figure 5:
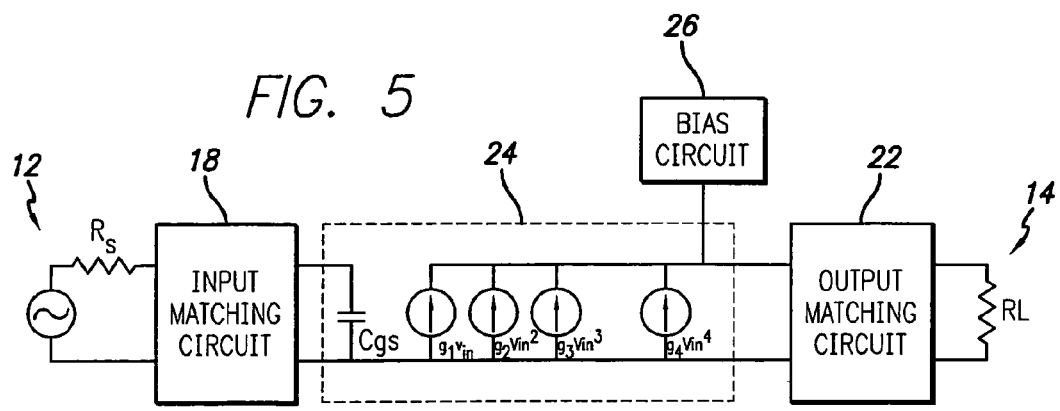
FIG. 5 is a schematic drawing of an amplifier circuit representation with nonlinear trans-conductance model of the active device.

Referring to FIG. 5, the active amplifier device 24 has been modeled by a simplified equivalent circuit of the active device (shown inside the dashed box) where the $1^{st}$, $2^{nd}$ and $3^{rd}$ order terms of the transconductance are represented by current sources. It is noted that there are other sources of nonlinearity that are not listed here, but their contribution is regarded as being small in magnitude to justify this simplification.

As shown in FIG. 5, the output of the device equivalent circuit is connected to the output matching circuit 22 and the bias circuit 26. The RF matching circuit 22 is normally designed to provide the appropriate impedance to the device over the bandwidth of the RF signal. As discussed above, the bias circuit 26 has a low pass response and is responsible for feeding the device with the DC energy while blocking the RF energy from being wasted in the DC supply network. The bias line low pass circuit can be designed using discrete lumped components or distributed network or a hybrid combination to save real estate.

Figure 1:
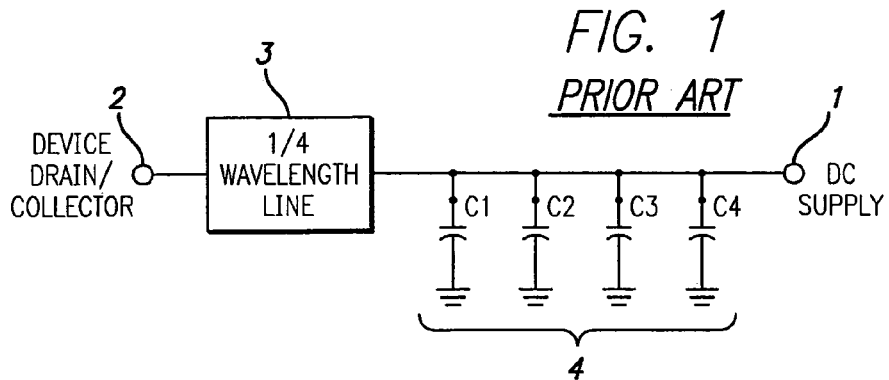
FIG. 1 is a schematic drawing of a prior art bias circuit.

First the effect on the amplifier operation of a conventional bias circuit such as shown in FIG. 1 where the first element looking into the circuit is an inductor 3 will be described. This inductor can be realized by a printed circuit line, often a quarter-wavelength-long at the RF center frequency. Quarter wavelength lines are generally preferred as they act as $2^{nd}$ harmonic traps, which can improve amplifier efficiency. However, shorter lines are also used. The input impedance of such a line if terminated by a low impedance load (shunt capacitor) is approximated by:

$$Z_{in} = jZ_0 \cdot \tan \beta \cdot l \qquad (4)$$

where $\beta$ ($\beta = 2\pi/\lambda$) is the propagation constant and l is the physical length. $Z_0$ is the line characteristic impedance. It is clear that as l approaches $\lambda/4$, the input impedance tends to increase very rapidly, providing an open circuit to the RF signal. For the power amplifier application, the width of this (DC feed line) line has to be large and often around or in excess of 80 milli-inch, reducing the $Z_0$. As a rule of thumb, the input impedance of the bias line is chosen to be an order of magnitude higher than the impedance looking into the matching circuit at the RF signal frequency. Despite the apparent satisfactory features, this circuit configuration is considered to be the root cause of the electrical memory effect.

While the combination described above will have relatively low reactive impedance at the video frequency (several MHz), this impedance is often large enough to create a considerable swing of video signal voltage in the output terminal of the active device. Moreover, as expected, the magnitude of the video voltage tends to increase with frequency when a current source is loaded with an inductive load and therefore, the IM3 byproduct is frequency dependant too. This additional (frequency dependant) contribution to IM3 is the portion that the predistorter linearizers cannot readily deal with.

Figure 6:
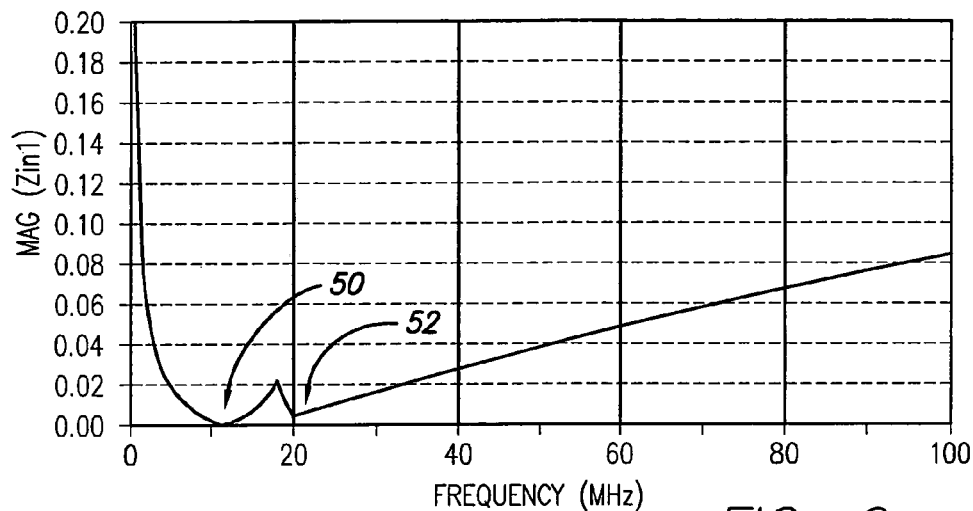
FIG. 6 is a graph showing the frequency dependence of series resonance in surface mount capacitors.
Figure 8:
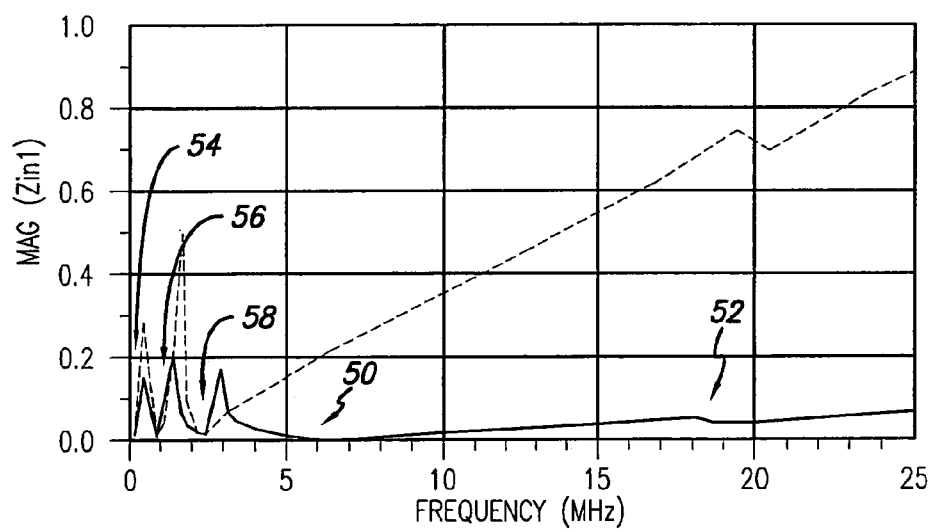
FIG. 8 is a graph showing the impedance frequency response of the bias circuit of FIG. 7.

The present invention uses the self-resonance of capacitor (s) used in the bias network to provide a low impedance path for the video signals. It is well known to those skilled in the art that all capacitors have series and parallel resonance frequencies. In surface mount capacitors, the series inductance is very small and therefore, the resonance frequency is relatively high. A typical frequency response showing the self-resonance of a pair of commercial surface mount capacitors (0.1 µF in parallel with 1 µF, ATC 1210 series) is shown in FIG. 6. Two resonance zeros 50, 52 are shown at about 10 and 20 MHz. The self-resonance property of the capacitor can thus be utilized to design low and almost constant impedance over a wide video frequency range. The manner in which they may be integrated into a bias circuit is shown in FIG. 7 and the resulting frequency response is shown in FIG. 8.

Referring to FIG. 7 a bias circuit configuration designed on the basis of the teachings of this invention is shown. Various other circuit topologies may also be implemented using the teachings of the invention and only one suitable implementation is shown. The bias circuit uses a combination of range capacitors and printed inductors to synthesize the desired frequency response in both RF and video frequency ranges. This particular implementation uses two parallel printed feed lines 68 and 69 to reduce video frequency impedance. A range of capacitors as shown in FIG. 7 is used to provide a distributed set of transmission zeros at the video frequencies. This configuration also insures that a relatively high impedance level is guaranteed to prevent RF leakage into the DC bias circuit.

More specifically, a DC supply 28 is coupled (via a small inductor 82—e.g., 10 nH) to a first set of capacitors 32 having series resonance transmission zeros distributed over a lower portion of the video frequency range, e.g., covering the range DC to 5 MHz. Four such capacitors 34, 36, 38 and 40 are illustrated but more or fewer may be employed. These are coupled to the device drain/collector connection 30 by parallel DC feed lines 68 and 69 which reduce the video impedance relative to a single feed line. These parallel feed lines 68 and 69 may be implemented as printed transmission lines on the amplifier substrate.

Although both feed lines are preferably uninterrupted printed lines of approximately equal length, feed line 69 is illustrated as three segments 66, 72 and 74 since the capacitors coupled to the feed line will cause each segment to contribute to the feed line impedance in a different manner and the effective line lengths L1, L2 and L3 may be adjusted by selectively placing the capacitors as discussed below. These feed lines should also provide an inductance at the RF carrier frequency of about ten times the impedance of the active device and output matching circuit. For example, the transmission lines should have a length equal to one sixteenth to one quarter wavelength at the RF carrier wavelength to provide a suitable RF impedance. To fix this effective length an RF short capacitor 64 may provide a short to ground at RF near the junction of the two branches of the parallel transmission lines 68, 69 at a distance from the device drain/collector connection 30 equal to one sixteenth to one quarter wavelength at the RF carrier wavelength. In addition to the transmission zeros provided by series resonance of decoupling capacitors 32 higher video frequency range transmission zeros are provided by placing additional capacitors along transmission line 69 closer in to the drain/collector connection 30. In the example of FIG. 7, two capacitors 60 and 62 are provided spaced apart from drain/collector connection 30 by a segment 72 of transmission line 69. Generally, it is desired to minimize the inductance of the segment of transmission line 72 by keeping its length L1 as short as possible, i.e., by placing capacitors 60 and 62 as close as possible to the drain contact 30 as compatible with the capacitor mounting requirements. In particular, L1 should be less than one sixteenth of the RF carrier wavelength. The lengths of transmission line segments 76, 78 and 80 also shown in FIG. 7 are less critical as inductance of the transmission lines connecting the circuit elements will have less affect on the lower frequency series resonance values of capacitors 32. The capacitors 60, 62 are relatively large and in one example have capacitances in the range of 0.1–1 µF. It should be emphasized that although the capacitance values are large, this is no detriment to the output RF matching circuit performance as the series inductance (of the capacitor) is also part of a shunt parallel resonance circuit at the RF frequencies. This shunt resonance circuit is formed by addition of a very small (pico-Farad range) tuning capacitor 70 to the RF matching circuit and ensures that a high RF impedance is maintained and no intricacy of RF matching circuit could result.

Referring to FIG. 8, the capacitor values and the resonance frequencies are chosen to provide transmission zeros (or impedance minima) at the desired frequencies spaced across the video bandwidth (MHz range), e.g., zeros 50, 52, 54, 56 and 58 shown in FIG. 8. In particular, zeros 50 and 52 provided by series resonance characteristics of surface mount capacitors 60 and 62 are located in a higher portion of the video bandwidth and prevent a monotonic increase in the video frequency impedance (shown by the dashed line in FIG. 8).

In other variances of this design, the RF tuning capacitor can be realized as part of the low pass output distributed matching network. Also, the two printed inductor feed lines could be replaced by a single transmission line with smaller characteristic impedance. The number of transmission zeros can be increased for broadband application and the overall shunt inductance can be resonated in a fashion explained above.

The present invention as described above thus provides a bias circuit which reduces power amplifier memory effects in general and is specifically advantageous when the RF amplifier is used in conjunction with predistortion linearization. Such an application is illustrated in FIG. 9 which shows a feed forward amplifier employing predistortion linearization and employing a bias circuit which reduces power amplifier memory effects, as described above.

Referring to FIG. 9 a feed forward amplifier 110 is illustrated in a block schematic drawing. The feed forward amplifier 110 includes an input 112 which receives an input RF signal to be amplified and an output 114 which outputs the amplified RF signal. As discussed above, the RF signal may be a high bandwidth signal such as a CDMA spread spectrum communication signal or W-CDMA such as UMTS, or other high video bandwidth signal. The input RF signal is split into a main amplifier signal path and an error amplifier signal path at input coupler 130 in accordance with well known feed forward amplifier design. The main amplifier signal path includes main amplifier 116 which is biased via bias network 26, as illustrated. More specifically, main amplifier 116 is biased by a bias circuit 26 described above so that negative impact of the bias circuit impedance across the video bandwidth is minimized while avoiding power loss due to RF impedance mismatch.

The main amplifier signal path further includes input and pre-distortion circuitry 120. The input circuitry may include a preamplifier, group delay circuitry, and gain and phase control circuitry generally in accordance with conventional feed forward design. The pre-distortion circuitry in turn pre-distorts the input signal to reduce IMDs introduced by main amplifier 116. Although the pre-distortion circuitry 120 may be conventional in general design and operation, in combination with the main bias network 26 described above it allows the main amplifier 116 to be operated across a wide video bandwidth with reduced distortion, compared to the use of existing bias methods. A pilot signal source 122 provides a pilot signal which is injected into the main amplifier input as illustrated and is used to control the input and pre-distortion circuitry 120. In particular, the pilot signal is extracted at the amplifier output by pilot sampling coupler 125 and used by controller 124 to control the input and pre-distortion circuitry 120 to minimize the pilot signal in the output signal and thereby minimize distortion in the output signal. The main amplifier signal path further includes a main amplifier output sample coupler 126 and delay 128, generally in accordance with conventional feed forward design.

Still referring to FIG. 9, the error amplifier signal path includes input signal coupler 130 which samples the RF input signal and provides it to the error amplifier 134 via delay 132, attenuator/combiner 136 and pre-error input circuitry 138. More specifically, delay 132 and attenuator/combiner 136 operate as in a conventional feed forward amplifier such that the sampled output of the main amplifier 116 is attenuated and combined with the delayed input signal at attenuator/combiner 136 to substantially cancel all but the distortion component of the sampled signal from the main signal path. In some applications and implementations it may be advantageous to control the cancellation at attenuator/combiner 136 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error input circuitry 138. Pre-error input circuitry may include a preamplifier, group delay circuitry, and gain and phase control circuitry which operates similarly to circuitry 120. However, unlike circuitry 120 a pre-distortion circuit is not required in the error path due to the highly linear nature of the error amplifier.

The output of circuitry 138 is provided to error amplifier 134 which restores the magnitude of the sampled distortion components (IMDs) to that in the main signal path. Error amplifier 134 includes bias network 140 which may correspond to bias network 26 in design. Alternatively, the requirements placed on error amplifier may in some cases not require the same impedance control and a less complex bias network may be employed in some cases for space or cost reasons.

Still referring to FIG. 9, the amplified distortion component output from error amplifier 134 is combined with the delayed main signal at 180 degrees (out of phase) with the main amplifier output at error injection coupler 142 to cancel the distortion component in the main signal path. A substantially distortion free amplified signal is then provided to the output 114. Any residual distortion is detected by the pilot detect circuitry 124 and used by the controller to provide control signals to circuitry 120 and 138 under the control of controller 124 which may be a suitably programmed microcontroller. These two controls may be essentially independent and may be viewed as control of two separate loops; loop 1 comprising circuitry 120, main amplifier 116, main amplifier output sample coupler 126, input signal coupler 130, group delay 132 and combiner 136, and loop 2 comprising sample coupler 126, attenuator/combiner 136, pre-error circuit 138, error amplifier 134, delay 128 and error injection coupler 142.

The present invention describes a bias circuit and method that is readily applicable to RF amplifiers designed for wideband applications used with or without a linearizer. When an unlinearised amplifier incorporating the described bias circuit is used to amplify an RF signal with signal bandwidth of>1–5 MHz, the raw amplifier IMD distortion levels can be improved by the reduction of bias-related memory effects. This improvement is most notable with power transistors possessing a very low output impedance, where it is important to minimize the ratio of the device output impedance to that of the bias network at modulation frequencies.

The bias circuit of this invention is specifically advantageous when the RF power amplifier is used in conjunction with predistortion linearization, where the amplifier memory effects are difficult to correct by even the most sophisticated techniques.

Several embodiments of the bias circuit have been described. A preferred embodiment of the present invention in an RF power amplifier and in a feed forward RF power amplifier design employing predistortion linearization have also been described. Nonetheless, it will be appreciated by those skilled in the art that a variety of modifications and additional embodiments are possible within the teachings of the present invention. For example, a variety of specific bias circuit implementations may be provided employing the teachings of the present invention and the theory of operation described and limitations of space prevent an exhaustive list of all the possible circuit implementations or an enumeration of all possible capacitor values and combinations since these will vary with the specific application and video bandwidth. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. A feed forward amplifier, comprising:
   an RF input for receiving an RF signal having an RE carrier and a modulation bandwidth of at least 10 MHz;
   a predistortion circuit receiving and predistorting said RF input signal;
   a main amplifier receiving and amplifying said predistorted RF signal, said main amplifier comprising an active device and a bias circuit coupled to a DC power supply, said bias circuit having a transfer function having a plurality of transmission zeros spaced across the modulation bandwidth so as to substantially eliminate amplifier memory effects;
   a main amplifier output sampling coupler;
   a first delay coupled to the RF input and providing a delayed RF signal;
   a carrier cancellation combiner coupling the delayed RF signal to the sampled output from the main amplifier;
   an error amplifier receiving and amplifying the output of the carrier cancellation combiner;
   a second delay coupled to the output of the main amplifier;
   an error injection coupler combining the output from the error amplifier and the delayed main amplifier output from the second delay so as to cancel distortion introduced by the main amplifier; and
   an RF output coupled to the error injection coupler output and providing an amplified RF output.

* * * * *